United States Patent
Liu et al.

(10) Patent No.: US 6,211,063 B1
(45) Date of Patent: Apr. 3, 2001

(54) METHOD TO FABRICATE SELF-ALIGNED DUAL DAMASCENE STRUCTURES

(75) Inventors: Jen-Cheng Liu, Chia-Yih; Chia-Shia Tsai, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/318,020

(22) Filed: May 25, 1999

(51) Int. Cl.[7] .............................................. H01L 21/4763
(52) U.S. Cl. ........................ 438/624; 438/637; 438/618
(58) Field of Search ..................................... 438/624, 625, 438/626, 637, 638, 639, 675, 674, 673, 618

(56) References Cited

U.S. PATENT DOCUMENTS

| | | | |
|---|---|---|---|
| 5,565,384 | 10/1996 | Havemann | 437/228 |
| 5,607,773 | 3/1997 | Ahlburn et al. | 428/427 |
| 5,728,630 | 3/1998 | Nishimura et al. | 438/763 |
| 5,818,111 | 10/1998 | Jeng et al. | 257/776 |
| 6,017,818 * | 1/2000 | Chung et al. | 438/637 |
| 6,037,213 * | 3/2000 | Shih et al. | 438/253 |
| 6,054,384 * | 4/2000 | Wang et al. | 438/637 |
| 6,071,806 * | 5/2000 | Wu et al. | 438/622 |
| 6,093,632 * | 6/2000 | Lin | 438/618 |

* cited by examiner

*Primary Examiner*—David Nelms
*Assistant Examiner*—Dung A Le
(74) *Attorney, Agent, or Firm*—George O. Saile; Stephen B. Ackerman; Rosemary L. S. Pike

(57) ABSTRACT

A method to form dual damascene structures is described. A first silicon oxynitride layer is deposited overlying a provided substrate. A silicate glass layer is deposited overlying the first silicon oxynitride. A second silicon oxynitride layer is deposited overlying the silicate glass. Photoresist is deposited overlying the second silicon oxynitride and is etched to define areas of planned lower trenches. The second silicon oxynitride layer is etched to expose the top surface of the silicate glass layer. The remaining photoresist layer is etched away. An hydrogen silsesquioxane layer is deposited overlying the second silicon oxynitride and the silicate glass. An oxide layer is deposited overlying the hydrogen silsesquioxane. Photoresist is deposited overlying the oxide and is etched to define areas of planned upper trenches. The oxide layer and the hydrogen silsesquioxane layer are etched by reactive ion etching by a recipe comprising $C_4F_8$, CO, Ar, and $N_2$ gases to form the upper trenches. The second silicon oxynitride acts as an etch stop. The silicate glass is etched by reactive ion etching by a recipe comprising $C_4F_8$, CO, and Ar gases to form the lower trenches. The first silicon oxynitride acts as an etch stop. A metal layer is deposited filling the trenches. The metal layer is etched back to the top surface of the oxide.

18 Claims, 6 Drawing Sheets

METHOD TO FABRICATE SELF-ALIGNED DUAL DAMASCENE STRUCTURES

BACKGROUND OF THE INVENTION (1) Field of the Invention

The present invention relates to the fabrication of semiconductor structures, and more particularly, to a method to fabricate self-aligned dual damascene structures in the manufacture of integrated circuits.

(2) Description of the Prior Art

At integrated circuit feature sizes of 0.18 microns and below, it becomes advantageous to construct metal connections out of copper instead of aluminum. Copper has a lower resistivity than aluminum, and therefore can form higher speed connections for a given line width.

The disadvantage of copper, however, is that it is more difficult to reliably etch than aluminum. To create copper traces, therefore, an alternative design approach is used. For conventional aluminum processing, metal is first deposited over a relatively flat surface and then patterned and etched to create connective traces. Alternatively, in copper processing, trenches are first cut into the isolation dielectric material where connective traces are planned. Then the metal is deposited to fill the traces. A polishing process is then used to etch back any overfill of metal in the trenches. This approach of inlaying metal into trenches to form features in the metal layer is called a damascene process.

An extension of the damascene process is to use it to form upper metal layers and to connect such layers to lower metal layers through dual damascene vias. First, two trenches are formed in a stack with the upper trench of larger width than the lower trench. Then both trenches are filled in a single metal deposition. By selecting the trench isolation materials appropriately, the selectivity of reactive ion etch (RIE) processes can be advantageously used to make these dual damascene vias self-aligning. This approach allows very small lower metal line widths to be reliably connected to upper level metal features.

Referring to FIG. 1, a cross-section of a partially completed prior art self-aligned dual damascene structure is shown. A substrate layer 10 is depicted. The substrate layer 10 encompasses all underlying layers, devices, junctions, and other features that have been formed prior to the deposition and definition of the first metal layer 12. A first dielectric layer 14, typically composed of silicon oxynitride, has been deposited overlying the substrate 10 and the first metal layer 12. A first low k-value dielectric 16, typically composed of fluorinated silicate glass (FSG), has been deposited overlying the first dielectric 14. A low k-value dielectric is used in semiconductor processing to reduce the capacitive coupling of metal layers. Next, a second dielectric layer 18, typically composed of silicon oxynitride has been deposited overlying the lower k-value dielectric 16. The second dielectric layer 18 has been patterned and etched to create openings directly above the underlying first metal traces 12. A second low k-value dielectric layer 20, typically composed of an organic spin-on material such as hydrogen silsesquioxane (HSQ), has been deposited overlying the second dielectric layer 18. A third dielectric layer 22, composed of silicon oxide, has been deposited overlying the second low k-value dielectric 20. A photoresist layer 24 has been deposited overlying the third dielectric layer 22. Openings have been etched in the photoresist directly above the underlying metal traces 12.

As is shown in FIG. 1, the upper opening in the photoresist layer 24 is wider than the lower opening in the second dielectric layer 18. In subsequent processing, such upper trenches would be etched through the third dielectric layer 22 and the second low k-value layer 20. Lower trenches would then be etched through the first low k-value layer 16. If the RIE chemistry was selected properly, the second dielectric layer 18 would act as an etch stop for the upper trench etch. Likewise, the first dielectric layer 14 would act as an etch stop for the lower trench etch. A final etch to remove the remaining first dielectric layer would then expose the top surface of the first metal traces. After the two trenches are etched, a second metal layer of copper would then be deposited and etched back to finish the structure.

The dual damascene trench process described is called self-aligned. This process is self-aligned because, even if the trenches are misaligned to the underlying first metal traces, a careful final etch of the first dielectric layer will still create a working trench for metal deposition without creating shorts or voids.

Referring again to FIG. 1, a problem in the prior art is depicted. The RIE chemistry typically used for etching FSG layers is comprised of the gases $C_4F_8$, CO, and Ar. When HSQ is used to form the second low k-value layer 20, this RIE chemistry will not etch properly. In fact the HSQ acts as an etch stop, and HSQ residue is left not etched as is shown by 26.

One approach to improving the etch of a second low k-value layer 20 composed of HSQ is to add oxygen to the RIE etch chemistry such that the chemistry is comprised of the gases $C_4F_8$, CO, Ar, and $O_2$. This alternative does eliminate the HSQ etch stop but it creates a new problem shown in FIG. 2. The HSQ layer 20 etch profile reveals a bow or concave shape 28. This bowing is especially pronounced once the photoresist layer 24 is stripped. The bowing profile presents a very difficult metal step coverage profile for the deposited copper layer.

Several prior art approaches attempt to use HSQ and other low k-value spin-on glass (SOG) materials to reduce line capacitance in integrated circuits. U.S. Pat. No. 5,818,111 to Jeng et al teaches layering HSQ or other low k-value dielectrics with silicon dioxide layers to improve the stability and reliability of the HSQ layers. U.S. Pat. No. 5,565,384 to Havemann teaches the use of organic SOG to lower line capacitance and to act as an etch stop below silicon dioxide to facilitate various self-aligned via designs. U.S. Pat. No. 5,607,773 to Ahlburn et al discloses a method to form an intermetal dielectric composite of oxide-HSQ-oxide where the HSQ reduces the dielectric constant. U.S. Pat. No. 5,728,630 to Nishimura et al teaches a method to form an interlayer film using silicone ladder polymers with HSQ.

SUMMARY OF THE INVENTION

A principal object of the present invention is to provide an effective and very manufacturable method of fabricating integrated circuits with dual damascene structures.

A further object of the present invention is to provide a method of fabricating dual damascene structures with intermetal layers of HSQ, silicon dioxide, and FSG.

A yet further object of the present invention is to provide a method of fabricating dual damascene structures with intermetal layers of HSQ, silicon dioxide, and FSG where the problem of HSQ etch stop is eliminated.

Another yet further object of the present invention is to provide a method of fabricating dual damascene structures with intermetal layers of HSQ, silicon oxynitride, and FSG where the problem of HSQ etch profile bowing is eliminated.

Another object of the present invention is to provide a method of fabricating integrated circuits with self-aligned dual damascene vias.

Another object of the present invention is to provide a method of fabricating integrated circuits with dual damascene structures using a single RIE etch run with a two tep etch recipe comprising first an etch chemistry of $C_4F_8$, CO, Ar, and $N_2$ and second an etch chemistry of $C_4F_8$, CO, and Ar.

In accordance with the objects of this invention, a new method of fabricating an integrated circuit with dual damascene structures is achieved. A substrate layer is provided encompassing all underlying layers, devices, junctions, and other features that are formed prior to the deposition of a first metal layer. The first metal layer is etched to define conductive traces. A first silicon oxynitride layer is deposited overlying the substrate and the first metal layer. A low k-value dielectric of fluorinated silicate glass (FSG) is deposited overlying the first dielectric layer. A second silicon oxynitride layer is deposited overlying the FSG layer. The second silicon oxynitride layer is patterned and etched to create openings for the lower trenches directly above the underlying metal traces. A low k-value dielectric layer of an organic spin-on hydrogen silsesquioxane (HSQ) is deposited overlying the second silicon oxynitride layer. An oxide layer is deposited overlying the HSQ layer. A photoresist layer is deposited overlying the oxide layer. Openings for the upper trenches are etched in the photoresist layer directly above yet overlapping the underlying openings for the lower trenches. A single RIE etch run with a two step etch recipe comprising, first, an etch chemistry of $C_4F_8$, CO, Ar, and $N_2$ and, second, an etch chemistry of $C_4F_8$, CO, and Ar is performed. The first step of the etch recipe etches the upper trenches through the oxide layer exposed by the photoresist openings and through the HSQ layer to the top surface of the second silicon oxynitride layer and the top surface of the FSG layer. The second step of the etch recipe etches lower trenches through the FSG layer to the top surface of the underlying first silicon oxynitride layer. A final etch removes the first silicon oxynitride layer overlying the first metal traces. A second metal layer is deposited filling the dual damascene trenches so formed. Excess second metal layer is etched back to finish the structure and processing continues to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
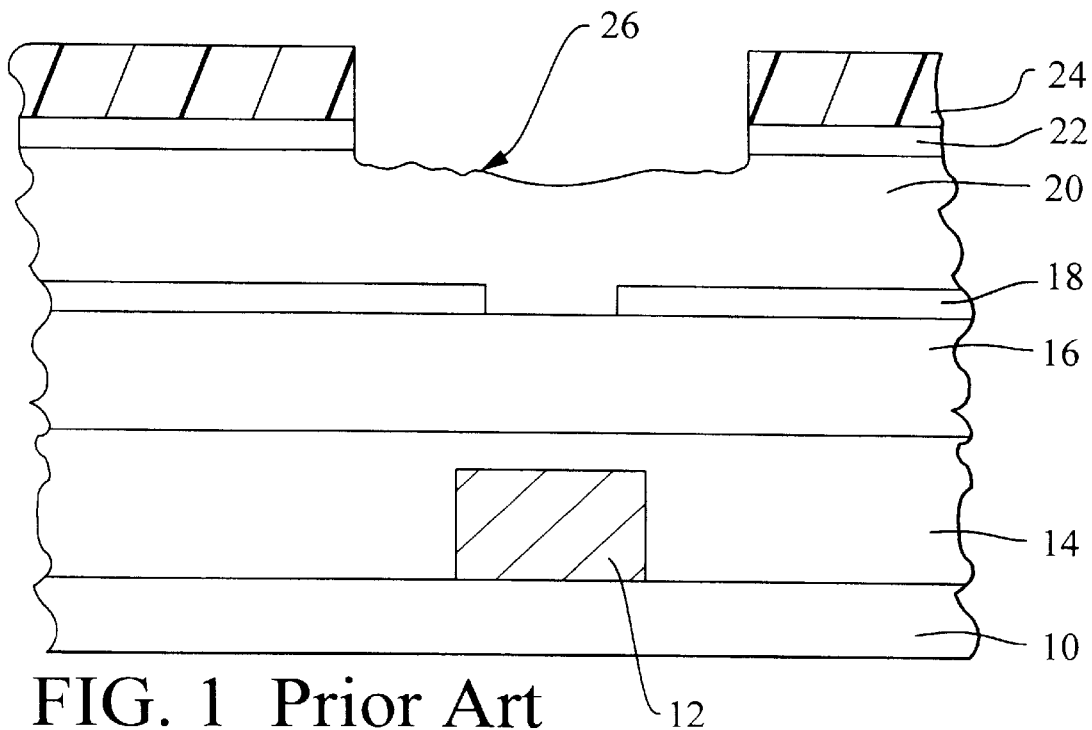
FIG. 1 schematically illustrates in cross-section a partially completed prior art integrated circuit showing the HSQ layer acting as an etch stop in the conventional RIE process.
Figure 2:
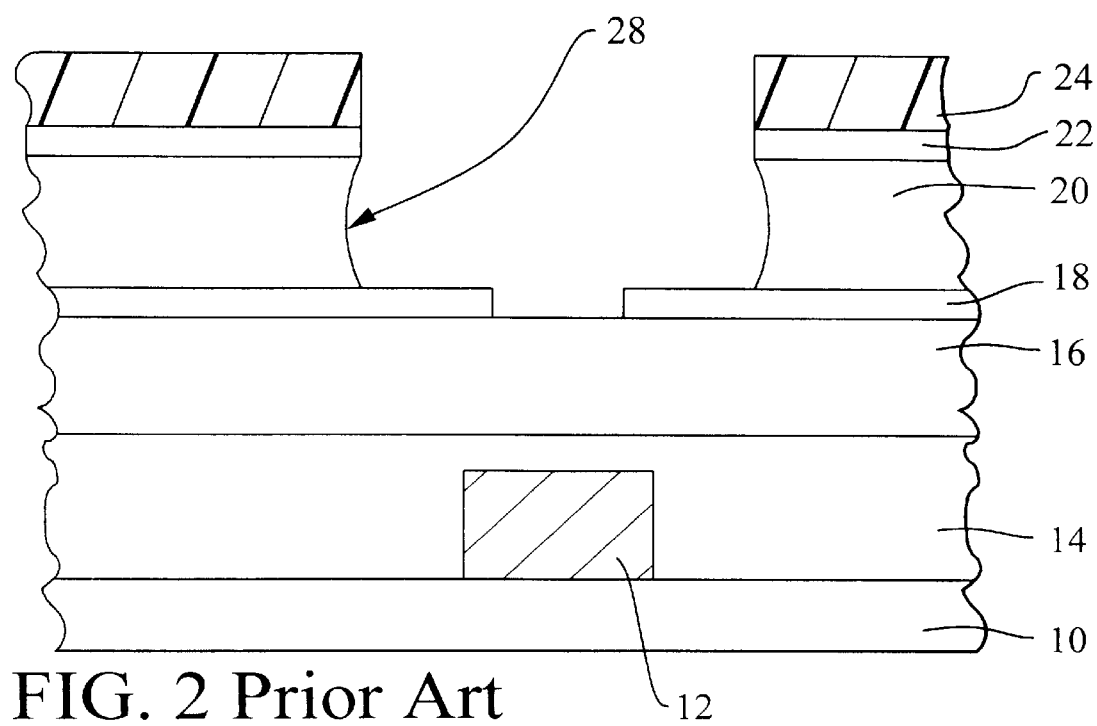
FIG. 2 schematically illustrates in cross-section a partially completed prior art integrated circuit showing a bowing profile on the etched HSQ layer when O2 is added to the conventional RIE process.
Figure 3:
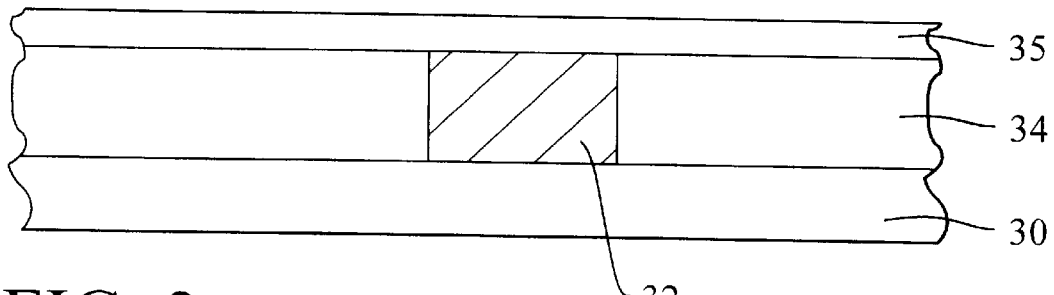
FIGS. 3 through 12 schematically illustrate in cross-sectional representation a preferred embodiment of the present invention used to create self-aligned dual damascene vias.

Referring now more particularly to FIG. 3, there is illustrated a portion of a partially completed integrated circuit. In this preferred embodiment, the present invention will be used to create self-aligned dual damascene vias. It will be understood by those skilled in the art that the invention could be applied to the formation of other structures, including dual damascene structures that don't serve as via openings between metal layers. Substrate 30 encompasses all underlying layers, devices, junctions, and other features that have been formed prior to the deposition of a first metal layer 32. The first metal layer 32 is formed by conventional means in a silicon oxide layer 34. A first silicon oxynitride layer 35 is deposited overlying the first metal layer 32 to a thickness of between about 4000 Angstroms and 5000 Angstroms.

Figure 4:
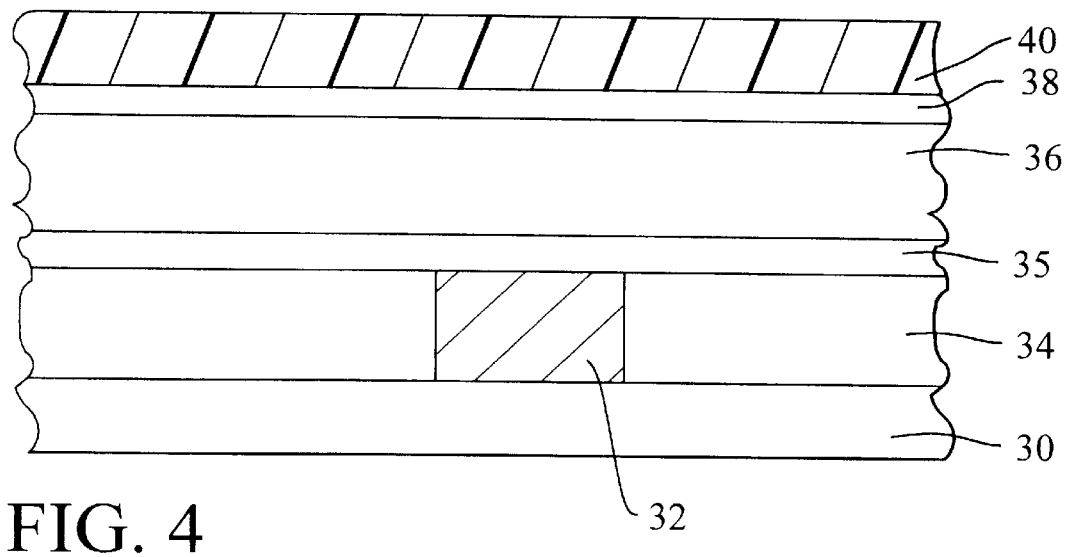

Referring now to FIG. 4, a layer of silicate glass 36 is conventionally deposited overlying the first silicon oxynitride layer 35. Preferably, the silicate glass is a fluorinated silicate glass (FSG) deposited to a thickness of between about 5000 Angstroms and 6000 Angstroms. FSG is used for this layer because it has a low k-value compared to other dielectrics such as silicon dioxide. FSG will reduce the capacitive coupling between first metal traces and second metal conductive traces. A second silicon oxynitride layer 38 is deposited overlying the FSG layer 36 to a thickness of between about 300 Angstroms and 1000 Angstroms. A photoresist layer 40 is deposited overlying the second silicon oxynitride layer.

Figure 5:
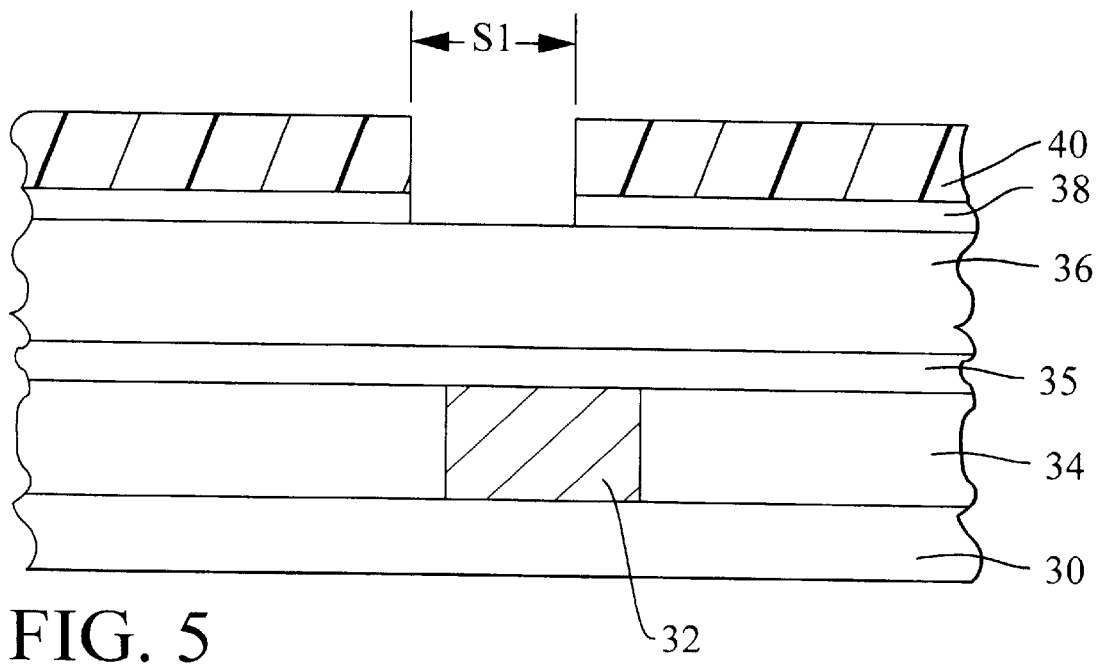

As shown in FIG. 5, the photoresist layer 40 is patterned and etched by a conventional photolithography and etch sequence to form an opening in the photoresist layer. The opening is designed to be located directly above the underlying metal lines. In the cross sectional depiction of FIG. 5, however, the opening is shown skewed to the left side. This skew was intentionally drawn to show how the self-aligned dual damascene via method used in the present invention will produce a useable via even with a significant misalignment of layers. The width of the opening S1 is preferably between about 0.3 microns and 0.5 microns. The width of this opening S1 will determine the width of the lower trench of the dual damascene structure. The lower trench must be kept narrow enough to make connection with the correct first metal trace 32 without shorting across other traces. The trench width must not be too narrow or the second metal layer will not completely fill the trench and voids will result. The second silicon oxynitride layer 38 is now etched through the opening in the photoresist layer 40 to the top surface of the underlying FSG layer 36.

Figure 6:
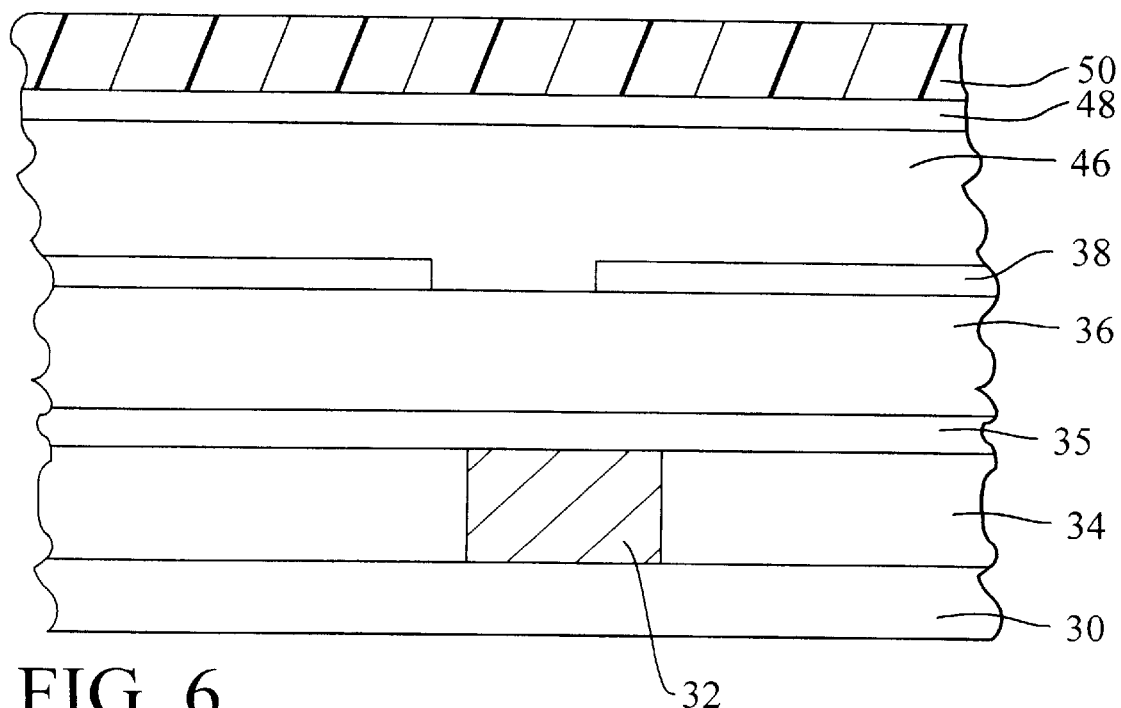

Referring now to FIG. 6, the remaining photoresist layer 40 is now etched away. A layer of hydrogen silsesquioxane (HSQ) 46 is spun-on overlying the surface of the second silicon oxynitride layer 38 and filling the opening for the lower trench. HSQ is used as a dielectric material herein because of its low k-value. HSQ will reduce capacitive coupling between second metal traces deposited in the dual damascene structures. The HSQ layer 46 is deposited to a thickness of between about 4000 Angstroms and 5000 Angstroms. In the preferred embodiment, the HSQ layer is Dow Corning Corporation's 9-5115 dielectric material.

In the prior art, plasma enhanced tetraethyl orthosilicate (PE—TEOS) or other CVD oxides have been used to fill the lower trench opening, but voids can form in this material. Such voids do not form in the HSQ material because it is spun-on and has both excellent gap filling properties and a low k-value.

A layer of plasma enhanced silicon dioxide 48 is deposited overlying the HSQ layer 46. The silicon dioxide layer 48 is preferably deposited to a thickness of between about 500 Angstroms and 600 Angstroms using a LPCVD process with tetraethyl orthosilicate (TEOS) as the source material. A layer of photoresist 50 is applied overlying the silicon dioxide layer 48.

Figure 7:
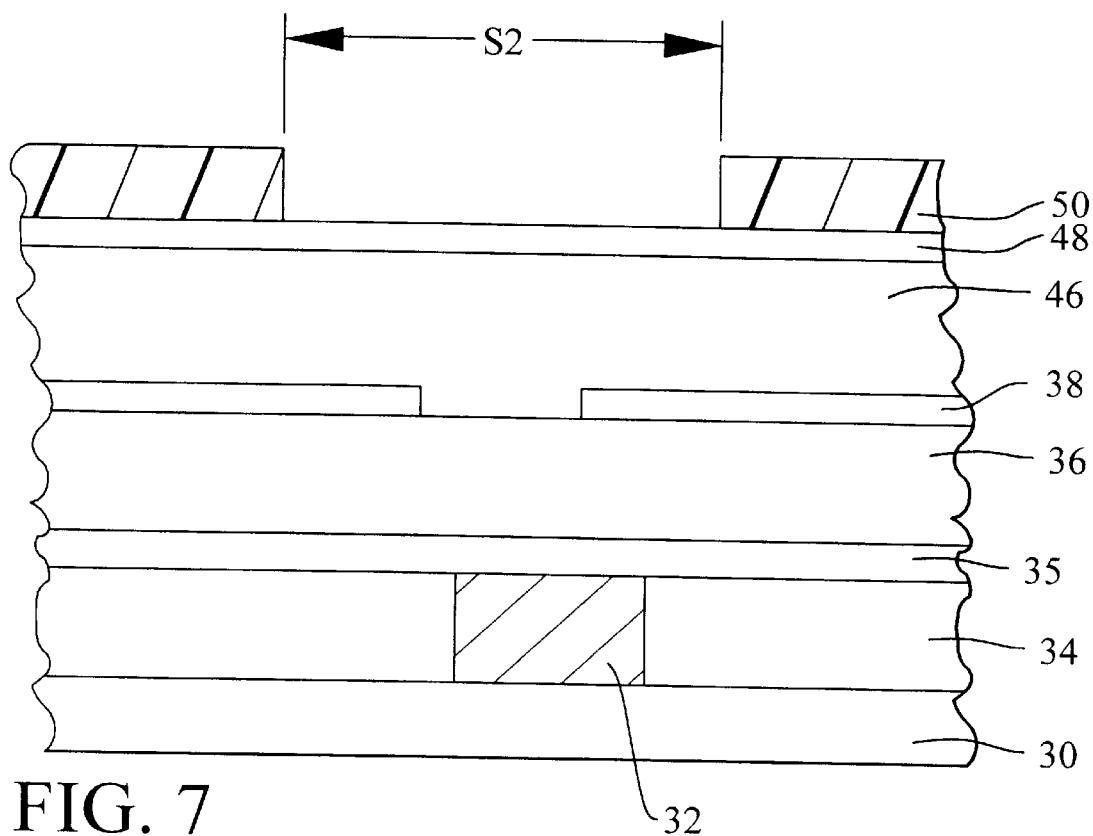

Referring now to FIG. 7, the photoresist layer 50 is patterned and etched by a conventional photolithography and etch sequence to form an opening in the photoresist layer. The opening is designed to be located directly above the underlying lower trench. In the cross sectional depiction of FIG. 7, however, the opening is shown skewed to the left side. This skew was again intentionally drawn to show how the self-aligned dual damascene via method used in the present invention will produce a useable via even with a significant misalignment of layers. The width of the opening S2 is preferably between about 0.4 microns and 0.6 microns. The width of this opening S2 will determine the width of the upper trench of the dual damascene structure.

Figure 8:
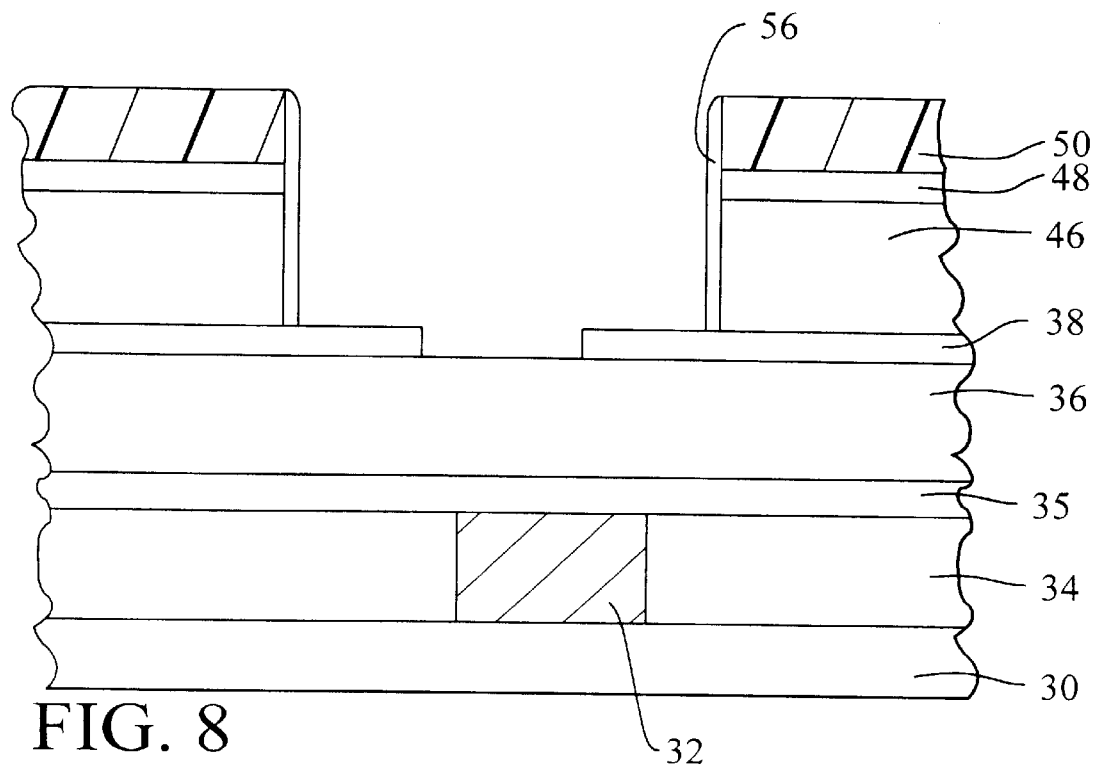

An important part of the present invention will now be described. As discussed in the prior art analysis, the problem to overcome in etching the upper trench is finding an RIE chemistry that will etch the HSQ layer 46, while not creating the bowing profile. The unique approach used in this invention is to add nitrogen gas ($N_2$) to the standard chemistry of $C_4F_8$, CO, and Ar. By adding $N_2$, an oxygen species is generated as the nitrogen replaces the oxygen in the carbon monoxide, releasing oxygen atoms into the reaction. The presence of the oxygen species allows the etching of the HSQ layer. In addition, a polymer is formed simultaneously by the combination of carbon and nitrogen. As shown in FIG. 8, this polymer forms a passivation layer 56 on the sidewall of the HSQ trench as it is being etched. The presence of the sidewall passivation prevents the formation of the bowing profile.

In the preferred embodiment, the RIE reactor is set to etch at between about 40 millitorr and 50 millitorr of pressure and between about 1200 Watts and 1500 Watts of power. The recipe chemistry used for the etch of the upper trench is comprised of between about 14 milliliters/second and 16 milliliters/second of $C_4F_8$, between about 270 milliliters/second and 330 milliliters/second of CO, between about 360 milliliters/second and 440 milliliters/second of Ar, and between about 80 and 100 milliliters/second of $N_2$. The etch time is between about 160 seconds and 200 seconds. The etch time is set up to allow for an overetch of the HSQ layer 46 of about 1500 Angstroms to insure that all of the HSQ is removed from the upper trench. The second silicon oxynitride layer 38 acts as an etch stop. After the upper trench etch is completed, the cross section of the self-aligned dual damascene via will look like FIG. 8.

Another important part of the present invention will now be described. Once the HSQ layer 46 of the upper trench has been etched, the chemistry of the RIE etcher must be changed. The presence of the nitrogen in the chemistry of the upper trench etch causes a reduction in the selectivity ratio between silicon oxide and silicon oxynitride. With this chemistry, the etch rates for silicon oxide and silicon oxynitride are too close in value. The silicon oxynitride cannot provide the etch stopping and trench boundary definition capability needed to successfully etch the smaller dimensioned lower trench. To address this problem, the nitrogen must be deleted from the recipe for etching the FSG layer 36 of the lower trench.

Figure 9:
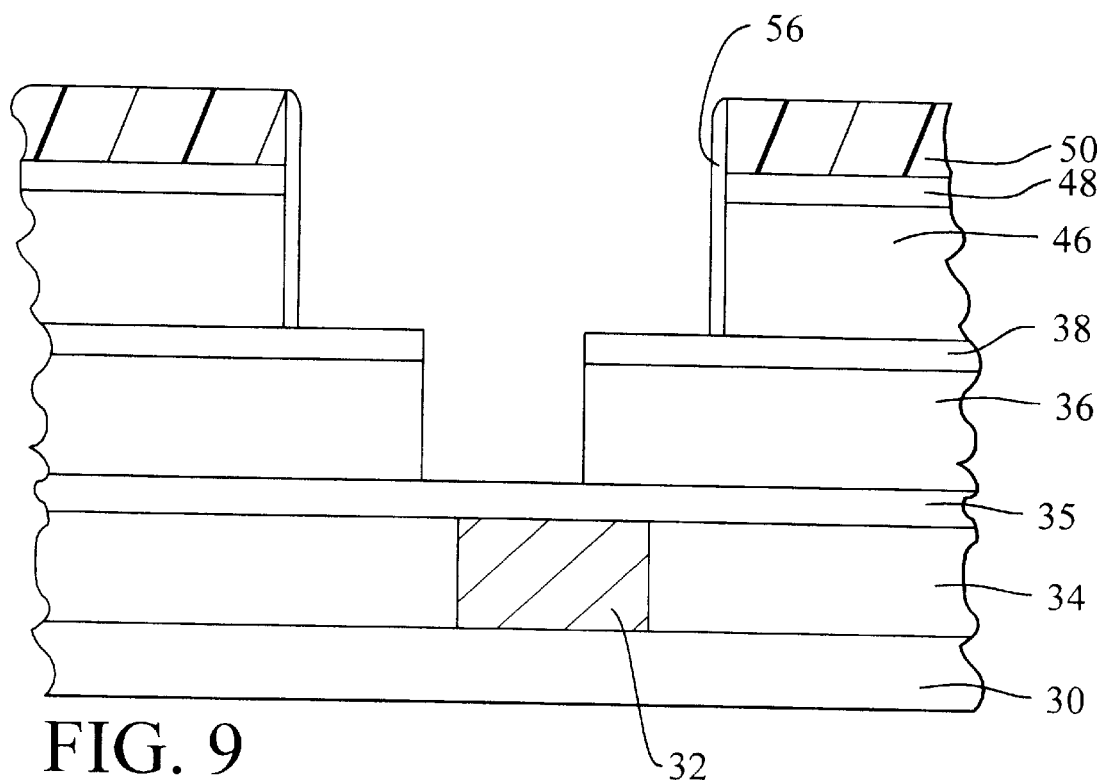

In the preferred embodiment, the RIE reactor is set to etch at between about 40 millitorr and 50 millitorr of pressure and between about 1200 Watts and 1500 Watts of power. The recipe chemistry used for the etch of the lower trench is comprised of between about 14 milliliters/second and 16 milliliters/second of $C_4F_8$, between about 270 milliliters/second and 330 milliliters/second of CO, and between about 360 milliliters/second and 440 milliliters/second of Ar. The etch time is between about 40 seconds and 60 seconds. The etch time is set up to allow for an overetch of the FSG layer 36 of about 2000 Angstroms to insure that all of the FSG is removed from the lower trench. The first silicon oxynitride layer 35 acts as an etch stop. After the lower trench etch is completed, the cross section of the self-aligned dual damascene via will look like FIG. 9.

Another important part of the invention is that both the upper and the lower trench etch recipes are run in the same RIE etcher. The recipes comprise a two step etching sequence that effectively creates the dual damascene profile that is needed to reliably manufacture the integrated circuit device.

Figure 10:
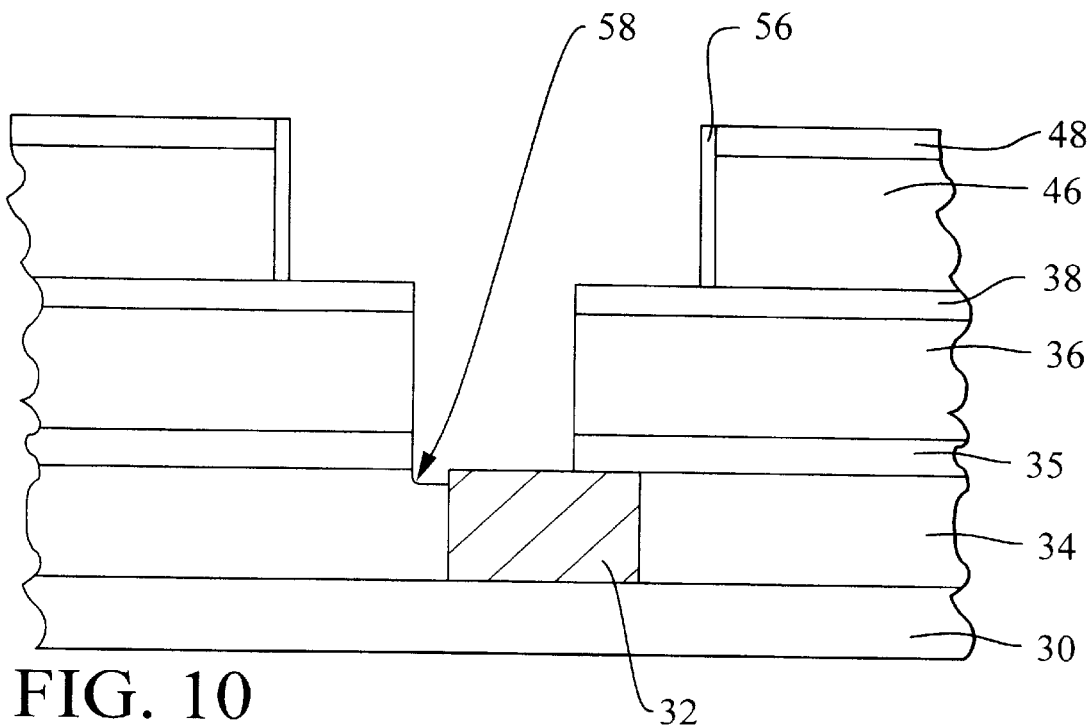

Referring now to FIG. 10, after the lower trench is etched, the remaining photoresist layer 50 is etched away. The first silicon oxynitride layer 35 that was the etch stop will be etched away to reveal the top surface of the first metal traces 32. The silicon oxynitride is etched using a conventional dry etch process. The key is to remove the silicon oxynitride layer carefully so that a good ohmic contact to the metal layer can be made. Note how FIG. 10 shows the result of the misalignments of the upper and lower trenches 58. The misalignment is not ideal, but the device will still work because the etch chemistry and the silicon oxynitride etch stop prevented the RIE process from reaching the metal layer 32.

Figure 11:
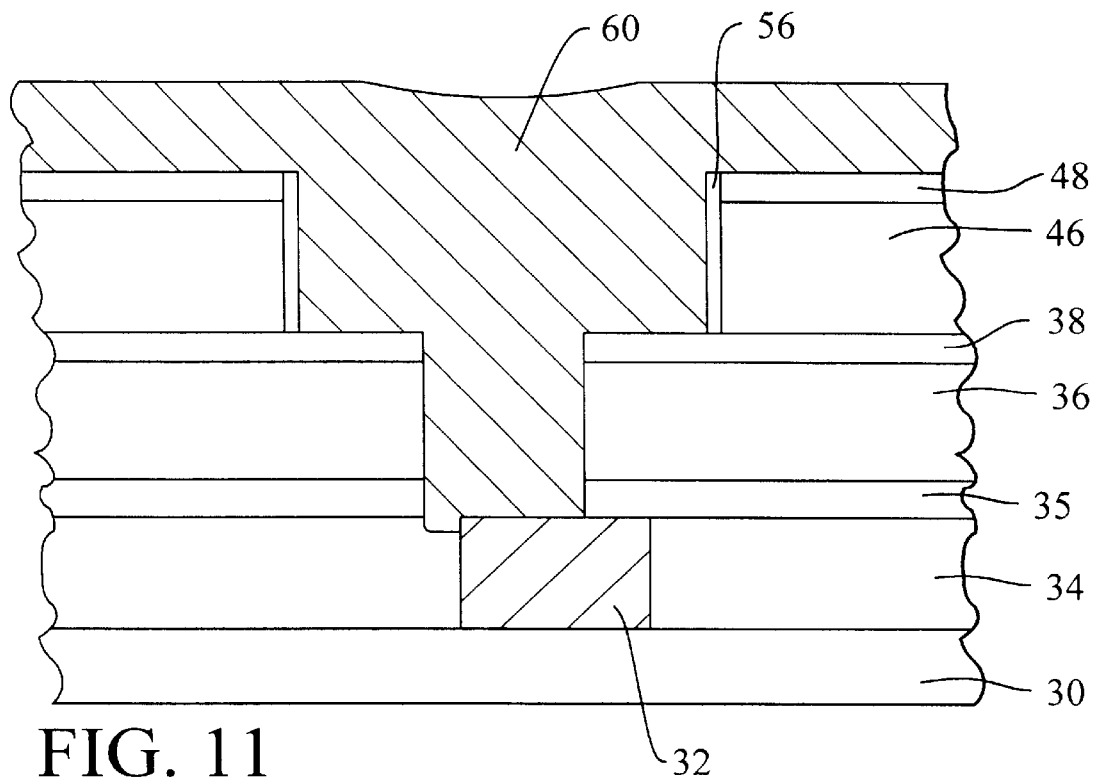

Referring now to FIG. 11, a second metal layer 60, preferably copper, is deposited by a copper plating process to a thickness of between about 10,000 Angstroms and 12,000 Angstroms to completely fill the dual damascene trenches.

Figure 12:
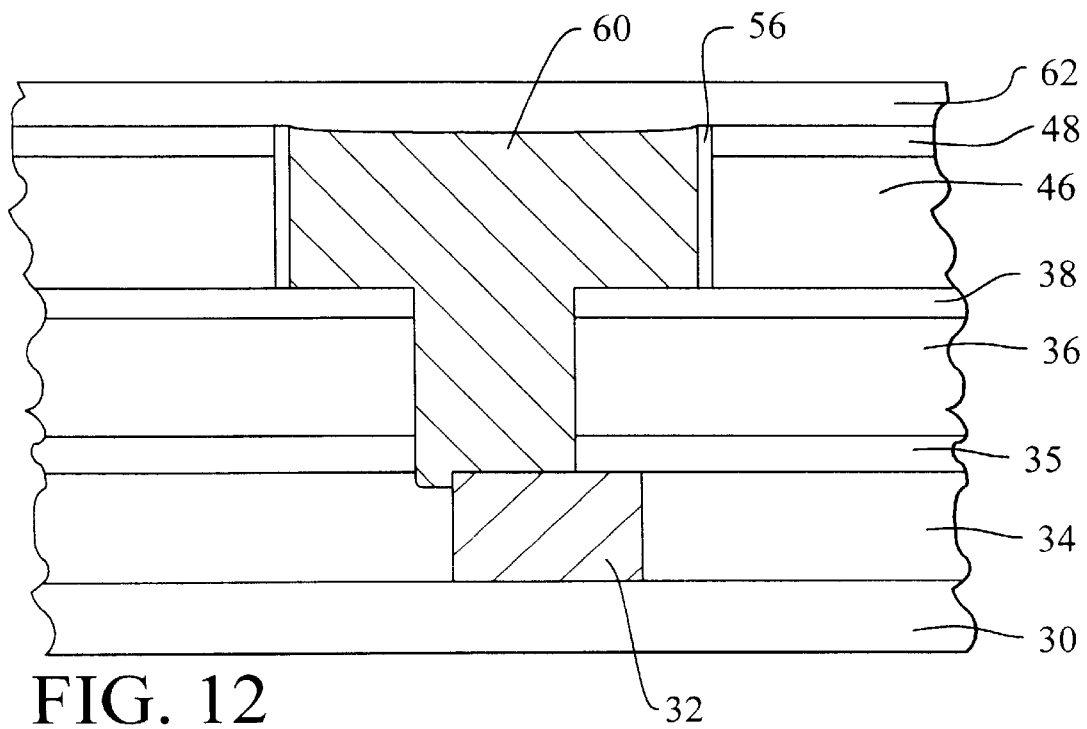

In FIG. 12 the completed self-aligned dual damascene via structure is shown. The second metal layer 60 is polished down to remove excess metal. Processing continues as is conventional in the art to complete the integrated circuit device. For example, a layer of passivation 62 is deposited overlying the surface of the device.

The process of the present invention provides a very manufacturable method for fabricating a self-aligned dual damascene structure in the fabrication of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form dual damascene structures in the fabrication of an integrated circuit device comprising:

depositing a first etch stop layer overlying a semiconductor substrate layer;

depositing a silicate glass layer overlying said first etch stop layer;

depositing a second etch stop layer overlying said silicate glass layer;

patterning said second etch stop layer thereby exposing the top surface of said silicate glass layer;

depositing an hydrogen silsesquioxane layer overlying said second etch stop layer and said exposed silicate glass layer;

depositing an oxide layer overlying said hydrogen silsesquioxane layer;

patterning said oxide layer and said hydrogen silsesquioxane layer by reactive ion etching including $N_2$ gas and thereby forming upper trenches; and etching away said silicate glass layer where not covered by said second etch stop layer using reactive ion etching not including $N_2$ gas and thereby forming lower trenches wherein said lower trenches and overlying said upper trenches form said dual damascene structures.

2. The method according to claim 1 wherein semiconductor device structures, including gate electrodes and associated source and drain regions and a first level of metalization, are formed in and on said semiconductor substrate underlying an insulating layer and said first etch stop layer.

3. The method according to claim 1 wherein said silicate glass is fluorinated silicate glass deposited to a thickness of between about 5000 Angstroms and 7000 Angstroms.

4. The method according to claim 1 wherein said second etch stop layer comprises silicon oxynitride deposited to a thickness of between about 500 Angstroms and 600 Angstroms.

5. The method according to claim 1 wherein said hydrogen silsesquioxane layer is deposited to a thickness of between about 4000 Angstroms and 5000 Angstroms.

6. The method according to claim 1 wherein said patterning of said oxide layer and said hydrogen silsesquioxane layer thereby forming said upper trenches is accomplished by reactive ion etching using an etching recipe comprising between about 14 milliliters/second and 16 milliliters/second of $C_4F_8$, between about 270 milliliters/second and 330 milliliters/second of CO, between about 360 milliliters/second and 440 milliliters/second of Ar, and between about 80 milliliters/second and 100 milliliters/second of $N_2$.

7. The method according to claim 1 wherein said etching away of said silicate glass layer where not covered by said second etch stop layer and thereby forming said lower trenches is accomplished by reactive ion etching using an etching recipe comprising between about 14 milliliters/second and 16 milliliters/second of $C_4F_8$, between about 270 milliliters/second and 330 milliliters/second of CO, and between about 360 milliliters/second and 440 milliliters/second of Ar.

8. The method according to claim 1 further comprising filling said dual damascene structures with a metal layer.

9. A method to form self-aligned dual damascene vias in the fabrication of an integrated circuit device comprising:

providing first metal conductive traces through an insulating layer overlying a semiconductor substrate;

depositing a first etch stop layer overlying said first metal conductive traces;

depositing a silicate glass layer overlying said first etch stop layer;

depositing a second etch stop layer overlying said silicate glass layer;

patterning said second etch stop layer thereby exposing the top surface of said silicate glass layer to define areas of planned lower trenches wherein said areas overlie said first metal conductive traces;

depositing an hydrogen silsesquioxane layer overlying said second etch stop layer and said silicate glass layer;

depositing an oxide layer overlying said hydrogen silsesquioxane layer;

patterning said oxide layer and said hydrogen silsesquioxane layer thereby forming said upper trenches having lateral widths of between about 0.4 microns and 0.5 microns wherein said upper trenches overlay said areas of planned lower trenches, wherein said etching away is accomplished by reactive ion etching including $N_2$ gas;

etching away said silicate glass layer where not covered by said second etch stop layer to said first etch stop layer and thereby forming said lower trenches having lateral widths of between about 0.3 microns and 0.5 microns, wherein said etching away is accomplished by reactive ion etching not including $N_2$ gas;

etching through said first etch stop layer to reveal the top surfaces of said first metal conductive traces and to complete said self-aligned dual damascene vias;

depositing a second metal layer filling said lower trenches and said upper trenches and contacting said first metal conductive traces; and etching back said second metal layer to remove excessive metal above the top surface of said oxide layer to complete the fabrication of the integrated circuit device.

10. The method according to claim 9 wherein said silicate glass is fluorinated silicate glass deposited to a thickness of between about 5000 Angstroms and 6000 Angstroms.

11. The method according to claim 9 wherein said second etch stop layer comprises silicon oxynitride deposited to a thickness of between about 500 Angstroms and 600 Angstroms.

12. The method according to claim 9 wherein said hydrogen silsesquioxane layer is deposited to a thickness of between about 4000 Angstroms and 5000 Angstroms.

13. The method according to claim 9 wherein said patterning of said oxide layer and said hydrogen silsesquioxane layer thereby forming said upper trenches is accomplished by reactive ion etching using an etching recipe comprising between about 14 milliliters/second and 16 milliliters/second of $C_4F_8$, between about 270 milliliters/second and 330 milliliters/second of CO, between about 360 milliliters/second and 440 milliliters/second of Ar, and between about 80 milliliters/second and 100 milliliters/second of $N_2$.

14. The method according to claim 9 wherein said etching away of said silicate glass layer where not covered by said second etch stop layer and thereby forming said lower trenches is accomplished by reactive ion etching using an etching recipe comprising between about 14 milliliters/second and 16 milliliters/second of $C_4F_8$, between about 270 milliliters/second and 330 milliliters/second of CO, and between about 360 milliliters/second and 440 milliliters/second of Ar.

15. The method according to claim 9 wherein said metal layer is copper.

16. A method to form self-aligned dual damascene vias in the fabrication of an integrated circuit device comprising:

providing first metal conductive traces through an insulating layer overlying a semiconductor substrate;

depositing a first silicon oxynitride layer overlying said first metal conductive traces;

depositing a silicate glass layer overlying said first silicon oxynitride layer;

depositing a second silicon oxynitride layer overlying said silicate glass layer;

patterning said second silicon oxynitride layer thereby exposing the top surface of said silicate glass layer to define areas of planned lower trenches wherein said areas overlie said first metal conductive traces;

depositing an hydrogen silsesquioxane layer overlying said second silicon oxynitride layer and said silicate glass layer;

depositing an oxide layer overlying said hydrogen silsesquioxane layer;

patterning said oxide layer and said hydrogen silsesquioxane layer thereby forming said upper trenches wherein said upper trenches overlay said areas of planned lower trenches, wherein said etching away is accomplished by reactive ion etching including $N_2$ gas, and wherein said upper trenches have lateral widths of between about 0.4 microns and 0.6 microns;

etching away said silicate glass layer where not covered by said second silicon oxynitride layer to said first silicon oxynitride layer and thereby forming said lower trenches, wherein said etching away is accomplished by reactive ion etching not including $N_2$ gas and wherein said lower trenches have a lateral width of between about 0.3 microns and 0.5 microns;

etching through said first silicon oxynitride layer to reveal the top surfaces of said first metal conductive traces and to complete said self-aligned dual damascene vias;

depositing a second metal layer filling said lower trenches and said upper trenches and contacting said first metal conductive traces; and etching back said second metal layer to remove excessive metal above the top surface of said oxide layer to complete the fabrication of the integrated circuit device.

17. The method according to claim 16 wherein said second silicon oxynitride layer is deposited to a thickness of between about 500 Angstroms and 600 Angstroms.

18. The method according to claim 16 wherein said second metal layer is copper.

* * * * *